(12) United States Patent
Kurauchi et al.

(10) Patent No.: US 9,923,473 B2
(45) Date of Patent: Mar. 20, 2018

(54) POWER SUPPLY APPARATUS FOR REDUCING NOISE INDUCED IN DC WIRES

(71) Applicant: DENSO CORPORATION, Kariya, Aichi-pref. (JP)

(72) Inventors: Shuji Kurauchi, Kariya (JP); Katsutoyo Misawa, Kariya (JP); Shotaro Yamasaki, Kariya (JP); Yuuichi Handa, Kariya (JP); Yuuki Takemoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/302,822

(22) PCT Filed: Apr. 6, 2015

(86) PCT No.: PCT/JP2015/060706
§ 371 (c)(1),
(2) Date: Oct. 7, 2016

(87) PCT Pub. No.: WO2015/156240
PCT Pub. Date: Oct. 15, 2015

(65) Prior Publication Data
US 2017/0033702 A1 Feb. 2, 2017

(30) Foreign Application Priority Data
Apr. 8, 2014 (JP) .................. 2014-079438

(51) Int. Cl.
*H02M 3/335* (2006.01)
*H02M 7/00* (2006.01)
(Continued)

(52) U.S. Cl.
CPC ........ *H02M 3/33569* (2013.01); *H01F 27/40* (2013.01); *H02M 7/003* (2013.01); *H01L 25/16* (2013.01); *H02M 3/337* (2013.01)

(58) Field of Classification Search
CPC ............. H02M 3/335; H02M 3/33538; H02M 3/33553; H02M 3/33569; H02M 7/003
See application file for complete search history.

(56) References Cited

U.S. PATENT DOCUMENTS

2006/0152318 A1* 7/2006 Isurin ...................... H01F 27/06
336/65
2008/0239759 A1* 10/2008 Nakahori ............ H01F 27/2804
363/20

(Continued)

FOREIGN PATENT DOCUMENTS

JP    2007-221919 A    8/2007
JP    2014-017971 A    1/2014

*Primary Examiner* — Fred E Finch, III
(74) *Attorney, Agent, or Firm* — Oliff PLC

(57) ABSTRACT

In a power supply apparatus, one of a transformer and a first semiconductor device is stacked on the other thereof to constitute a stack assembly. The stack assembly, a second semiconductor device, and a choke coil are located on the major surface. A primary direct-current wire, which connects the first semiconductor device to a direct-current power source, is drawn out from a first predetermined portion of the stack assembly. A primary alternating-current wire, which connects the first semiconductor device and the transformer, is drawn out from a second predetermined portion of the stack assembly. The primary direct-current wire and the primary alternating-current wire are located to be separated from each other via at least a part of the stack assembly.

10 Claims, 4 Drawing Sheets

(51) Int. Cl.
  *H01F 27/40* (2006.01)
  *H02M 3/337* (2006.01)
  *H01L 25/16* (2006.01)

(56) References Cited

U.S. PATENT DOCUMENTS

| | | | |
|---|---|---|---|
| 2009/0109709 A1* | 4/2009 | Nakahori | H02M 3/335 363/16 |
| 2009/0201005 A1* | 8/2009 | Noma | H02M 1/44 323/311 |
| 2012/0181874 A1* | 7/2012 | Willkofer | H01L 23/48 307/104 |
| 2012/0188712 A1* | 7/2012 | Ishibashi | H02M 7/003 361/688 |
| 2013/0301312 A1* | 11/2013 | Konishi | H02M 3/337 363/21.15 |
| 2014/0009971 A1* | 1/2014 | Itou | H02M 3/33507 363/21.01 |
| 2014/0233281 A1* | 8/2014 | Goto | H02M 7/003 363/39 |
| 2014/0321065 A1* | 10/2014 | Nishimura | H05K 1/0203 361/722 |
| 2015/0029757 A1* | 1/2015 | Kurauchi | H02M 3/335 363/16 |
| 2015/0029759 A1* | 1/2015 | Takemoto | B60L 11/00 363/17 |
| 2015/0036388 A1* | 2/2015 | Handa | H02M 3/28 363/15 |
| 2015/0171736 A1* | 6/2015 | Takemoto | H02M 1/44 363/17 |

* cited by examiner

US 9,923,473 B2

POWER SUPPLY APPARATUS FOR REDUCING NOISE INDUCED IN DC WIRES

TECHNICAL FIELD

The present disclosure relates to power supply apparatuses equipped with a transformer.

BACKGROUND ART

For example, a power supply apparatus disclosed in patent document 1 is known as a power supply apparatus of, for example, DC-DC converters. The power supply apparatus includes a transformer, a primary semiconductor component, a secondary semiconductor component, and a choke coil. The primary semiconductor component is connected to the primary coil of the transformer, and the secondary semiconductor component is connected to the secondary coil of the transformer. The choke coil is connected to the secondary semiconductor component. These components are mounted on one of the major surfaces of a base plate; the major surfaces extend, i.e. spread, in a two-dimensional direction. Specifically, these components are arranged on one of the major surfaces while extending in the two-dimensional direction. The two-dimensional extending direction of the major surfaces of the base plate will be referred to merely as an extending direction.

CITATION LIST

Patent Document

[Patent Document 1] Japanese Patent Application Publication No. 2007-221919

SUMMARY

As described above, the transformer, primary semiconductor component, secondary semiconductor component, and choke coil are arranged on one of the major surfaces while two-dimensionally extending along one of the major surfaces in the power supply apparatus disclosed in the patent document 1. This arrangement may cause the base plate to increase in size in two dimension, resulting in two-dimensional size increase of the base plate of the power supply apparatus.

Then, we consider that a primary semiconductor component and a transformer may be mounted on a base plate while they are stacked to each other. This configuration reduces the size of the component mounting space on one major surface of the base plate, resulting in two-dimensional downsizing of the base plate of the power supply apparatus.

Let us consider a case where the stack of the primary semiconductor component and the transformer is mounted on the base plate. In this case, wires connecting the primary semiconductor component and other components, wires connecting the transformer and other components, and wires, i.e. alternating-current (AC) wires connecting the primary semiconductor component and the transformer may be arranged to be close to each other. In particular, if direct-current (DC) wires connecting the primary semiconductor component and a DC power source and the AC wires connecting the primary semiconductor component and the transformer are close to each other, an alternating current flowing through the AC wires may cause the risk that noise will be induced in the DC wires to increase.

The present disclosure has been created in view of such a problem. For example, the present disclosure aims to provide power supply apparatuses, each of which is capable of reducing noise induced in a DC wire due to an alternating current flowing through an AC wire while achieving the downsizing thereof.

Means for Solving Problem

A power supply apparatus according to an aspect of the present disclosure includes a stack assembly that includes a transformer including a primary coil and a secondary coil, and a first semiconductor device constituting a primary circuit connected to the primary coil of the transformer. One of the transformer and the first semiconductor device is stacked on the other thereof to constitute the stack assembly. The power supply apparatus includes a second semiconductor device constituting a secondary circuit connected to the secondary coil of the transformer, and a choke coil connected to the second semiconductor device. The power supply apparatus includes a base plate having a major surface. The stack assembly, the second semiconductor device, and the choke coil are located on the major surface. The power supply apparatus includes a primary direct-current wire connecting the first semiconductor device to a direct-current power source and drawn out from a first predetermined portion of the stack assembly. The power supply apparatus includes a primary alternating-current wire, connecting the first semiconductor device and the transformer, which is drawn out from a second predetermined portion of the stack assembly. The primary direct-current wire and the primary alternating-current wire are located to be separated from each other via at least a part of the stack assembly.

Advantageous Effects

One of the transformer and the first semiconductor device according to the aspect of the present disclosure is stacked on the other thereof to constitute the stack assembly. This configuration enables the two-dimensional mounting space of the major surface of the first semiconductor device and the transformer on the base plate. This results in two-dimensional downsizing of the base plate of the power supply apparatus.

The primary direct-current wire connects the first semiconductor device to the direct-current power source, and is drawn out from the first predetermined portion of the stack assembly. The primary alternating-current wire connects the first semiconductor device and the transformer, and is drawn out from the second predetermined portion of the stack assembly. The primary direct-current wire and the primary alternating-current wire are located to be separated from each other via at least a part of the stack assembly.

This configuration enables the primary direct-current wire to be separated from the primary alternating-current wire via at least part of the stack assembly without the primary direct-current wire being juxtaposed to the primary alternating-current wire.

This results in two-dimensional downsizing of the base plate and in reduction of the risk of noise being induced in the primary DC wire due to an alternating current flowing through the primary AC wire.

DESCRIPTION OF EMBODIMENTS

The following describes the embodiments of the present disclosure with reference to the accompanying drawings.

A DC-DC converter for stepping down a high DC voltage supplied from a DC power source into a low DC voltage can be applied to power supply apparatuses according to the respective embodiments. The power supply apparatuses of the embodiments of the present disclosure can be installed in various vehicles, such as electric vehicles and hybrid vehicles.

[First Embodiment]

Figure 1:
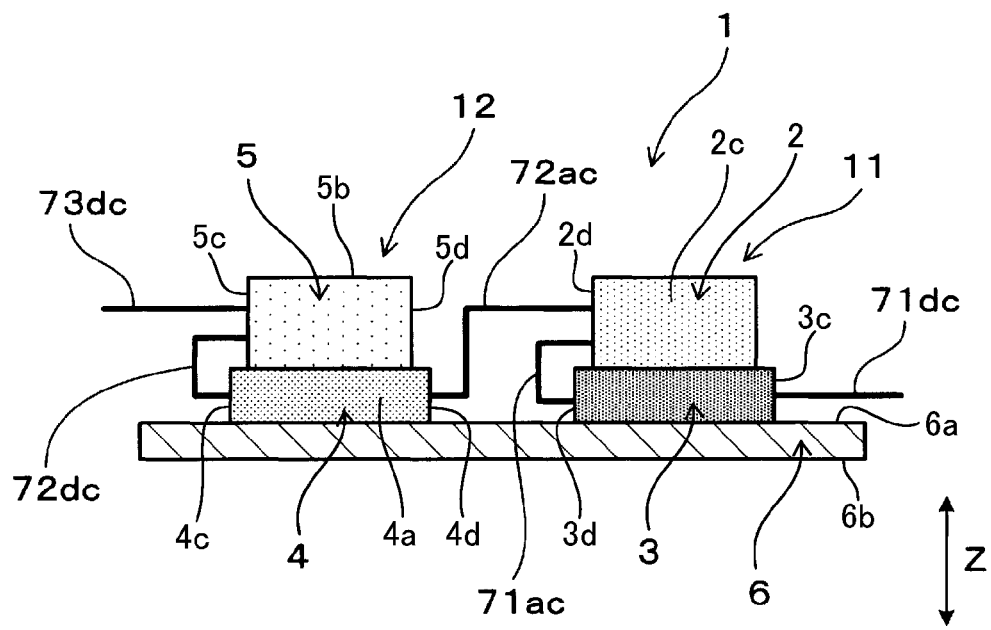
FIG. 1 is a side view illustrating the schematic structure of a power supply apparatus according to the first embodiment of the present disclosure when the apparatus is viewed from one side direction parallel to a major surface of a base plate.
Figure 2:
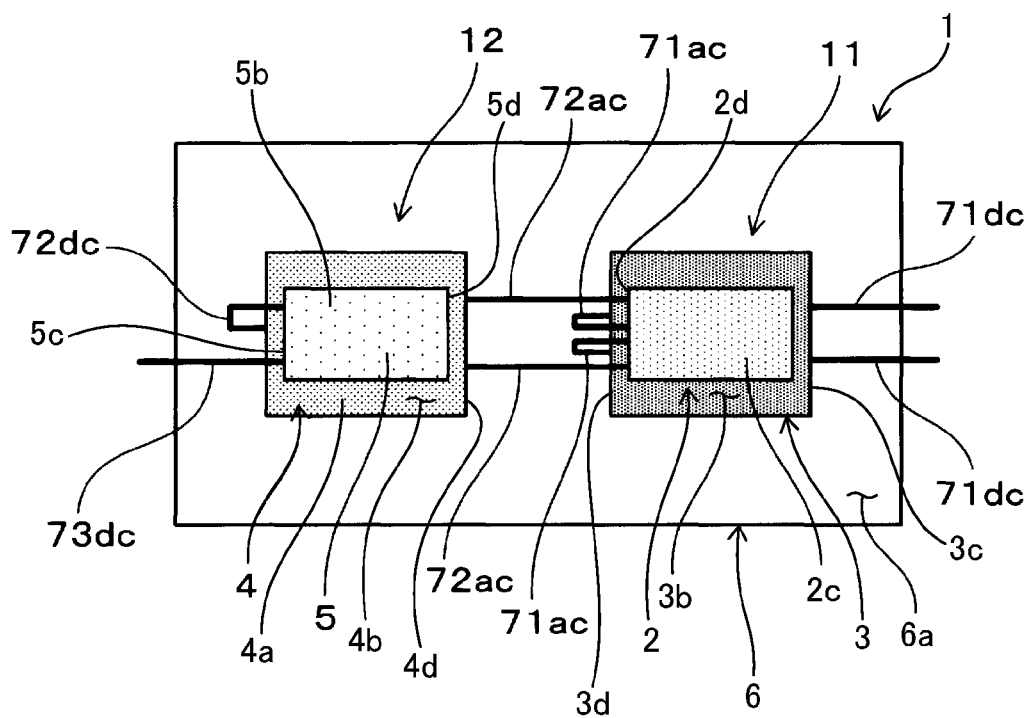
FIG. 2 is a plan view illustrating the schematic structure of the power supply apparatus according to the first embodiment when the apparatus is viewed from its upper side perpendicular to the major surface of the base plate.
Figure 3:
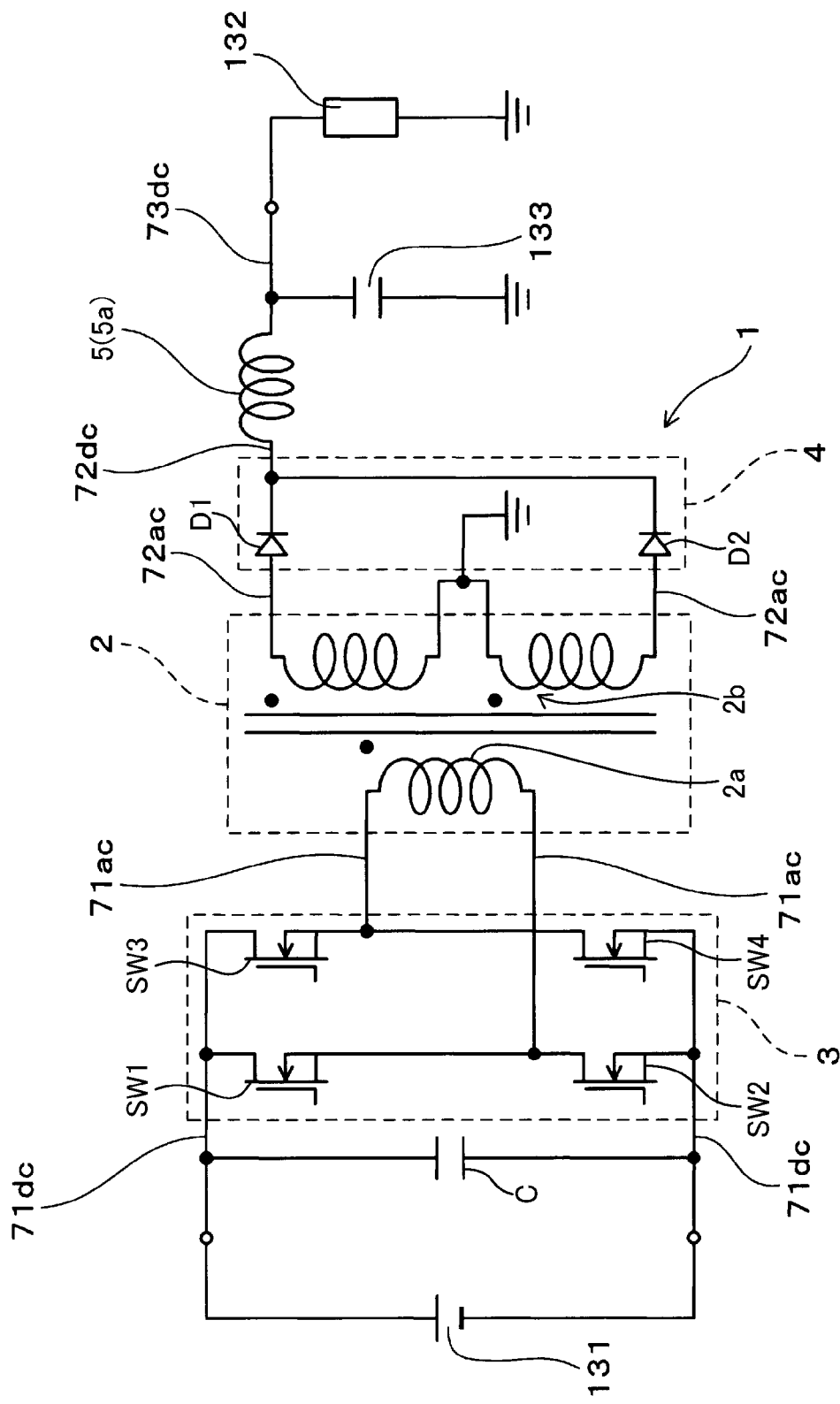
FIG. 3 is a circuit diagram illustrating the circuit structure of the power supply apparatus illustrated in FIGS. 1 and 2.

The following describes a power supply apparatus 1 according to the first embodiment of the present disclosure with reference to FIGS. 1 to 3.

Referring to FIGS. 1 and 2, the power supply apparatus 1 according to the first embodiment includes a transformer 2, a first semiconductor device 3, a second semiconductor device 4, a choke coil 5, and a base plate 6.

The transformer 2 includes a primary coil 2a and a secondary coil 2b magnetically coupled to the primary coil 2a (see FIG. 3).

The first semiconductor device 3 constitutes a primary circuit connected to the primary coil 2a of the transformer 2. The second semiconductor device 4 constitutes a secondary circuit connected to the secondary coil 2b of the transformer 2.

The choke coil 5 is connected to the secondary semiconductor device 4.

The base plate 6 has first and second major surfaces 6a and 6b each two-dimensionally extending. On the first major surface 6a or the second major surface 6b of the base plate 6, the transformer 2, the first and second semiconductor devices 3 and 4, and the choke coil 6 are mounted.

The first semiconductor device 3 is mounted on the first major surface 6a of the base plate 6, and, on the first semiconductor device 3, the transformer 2 is mounted. That is, the first semiconductor device 3 and the transformer 2 are mounted on the first major surface 6a of the base plate 6 while being stacked to each other. The first semiconductor device 3 and the transformer 2 constitute a first stack assembly 11.

Specifically, the transformer 2 is configured such that the primary coil 2a and the secondary coil 2b are installed in a substantially rectangular-parallelepiped package 2c. The first semiconductor device 3 includes a substantially rectangular-parallelepiped package 3a. The first semiconductor device 3 is mounted on the first major surface 6a of the base plate 6 while the bottom surface of the package 3a abuts on the first major surface 6a. The transformer 2 is mounted on the package 3a while the bottom surface of the package 2c abuts on the top surface 3b of the package 3a of the first semiconductor device 3.

The package 2c of the transformer 2 has side surfaces. The package 2c is mounted on the package 3a such that each side surface of the package 2c faces the same direction as the corresponding side surface of the package 3a and is substantially parallel to the corresponding side surface of the package 3a, thus constituting the first stack assembly 11.

Specifically, referring to FIGS. 1 and 2, the package 2c of the transformer 2 is smaller in size than the package 3a of the first semiconductor device 3. The package 2c is substantially mounted on the center portion of the top surface 3b of the package 3a.

The first semiconductor device 3 has DC input/output terminals, and the DC input/output terminals are connected to a DC power source 131 (see FIG. 3) via primary DC wires 71dc.

For example, each of the primary DC wires 71dc has a first end, and a second end opposite to the first end. The first end is connected to semiconductor elements in the package 3a of the first semiconductor device 3. Each of the primary DC wires 71dc, whose first end is connected to the semiconductor elements in the package 3a, is drawn out from a first side surface 3c of the package 3a and located to face the first side surface 3c. The second end of each of the primary DC wires 71dc is connected to the DC power source 131.

The first semiconductor device 3 also has AC input/output terminals, and the AC input/output terminals are connected to the primary winding 2a of the transformer 2 via primary AC wires 71ac.

For example, each of the primary AC wires 71ac has a first end, and a second end opposite to the first end. The first end is connected to the semiconductor elements in the package 3a of the first semiconductor device 3. Each of the primary AC wires 71ac, whose first end is connected to the semiconductor elements in the package 3a, is drawn out from a second side surface 3d, which is opposite to the first side surface 3c, of the package 3a and located to face the second side surface 3d. The second end of each of the primary AC wires 71ac is connected to the primary winding 2a of the transformer 2 in the package 2c via a side surface 2d of the package 2c of the transformer 2; the side surface 2d is closely juxtaposed to the second side surface 3d.

Specifically, the primary DC wires 71dc connect the first semiconductor device 3 and the DC power source 131, and the primary AC wires 71ac connect the first semiconductor device 3 and the transformer 2. The primary DC wires 71dc and the primary AC wires 71ac are disposed to respective outer surfaces, i.e. the respective opposing first and second side surfaces 3c and 3d, of the first stack assembly 11; the outer surfaces are different from each other and face different directions.

The secondary coil 2b of the transformer 2 is connected to the first end of each of the secondary AC wires 72ac having the first and second ends. Each of the secondary AC wires 72*ac*, whose first end is connected to the secondary coil 2*b* in the package 2*c*, is drawn out from the side surface 2*d* of the package 2*c* and located to face the side surface 2*d*. The second end of each of the secondary AC wires 72*ac* is connected to the second semiconductor device 4.

Specifically, the primary DC wires 71*dc* and the secondary AC wires 72, which connect the transformer 2 and the second semiconductor device 4, are disposed to respective outer surfaces, i.e. the respective opposing first and second side surfaces 3*c* and 2*d*, of the first stack assembly 11; the outer surfaces are different from each other and face different directions.

The primary DC wires 71*dc* are located across the first stack assembly 11 from the primary AC wires 71*ac*, and the primary DC wires 71*dc* are located across at least part of the first stack assembly 11, such as the whole of the first stack assembly 11, from the second AC wires 72*ac*.

The second semiconductor device 4 is mounted on the first major surface 6*a* of the base plate 6, and, on the second semiconductor device 4, the choke coil 5 is mounted. That is, the second semiconductor device 4 and the choke coil 5 are mounted on the first major surface 6*a* of the base plate 6 while being stacked to each other. The second semiconductor device 4 and the choke coil 5 constitute a second stack assembly 12.

Specifically, the choke coil 5 includes a coil body 5*a* (see FIG. 3) and a substantially rectangular-parallelepiped package 5*b*. The choke coil 5 is configured such that the coil body 5*a* is installed in the package 5*b*. The second semiconductor device 4 includes a substantially rectangular-parallelepiped package 4*a*. The second semiconductor device 4 is mounted on the first major surface 6*a* of the base plate 6 while the bottom surface of the package 4*a* abuts on the first major surface 6*a*. The choke coil 5 is mounted on the package 4*a* while the bottom surface of the package 5*b* abuts on the top surface 4*b* of the package 4*a* of the second semiconductor device 4.

The package 5*b* of the choke coil 5 has side surfaces. The package 5*b* is mounted on the package 4*a* such that each side surface faces the same direction as the corresponding side surface of the package 4*a*, thus constituting the second stack assembly 12.

Specifically, referring to FIGS. 1 and 2, the package 5*b* of the choke coil 5 is smaller in size than the package 4*a* of the second semiconductor device 4. The package 5*b* is mounted on substantially the center portion of the top surface 4*b* of the package 4*a*.

The first side surface 3*c* of the package 3*a* of the first semiconductor device 3 faces a first side surface 4*c* of the package 4*a* of the second semiconductor device 4.

The package 5*b* of the choke coil 5 has a first side surface 5*c* and a second side surface 5*d* opposite to the first side surface 5*c*. The side surface 2*d* of the package 2*c* of the transformer 2 faces the second side surface 5*d* of the package 5*b* of the choke coil 5.

Referring to FIG. 1, the direction in which the transformer 2 and the first semiconductor device 3 are stacked in the first stack assembly 11 and the direction in which the choke coil 5 and the second semiconductor device 4 are stacked in the second stack assembly 12 each match with the direction of the normal to the first major surface 6*a* of the base plate 6.

In other words, the first stack assembly 11 is configured such that the first semiconductor device 3 is disposed between the transformer 2 and the base plate 6. The second stack assembly 12 is configured such that the second semiconductor device 4 is disposed between the choke coil 5 and the base plate 6.

The second semiconductor device 4 has DC input/output terminals, and the DC input/output terminals are connected to one end of the choke coil 5 via a secondary DC wire 72*dc*.

For example, the secondary DC wire 72*dc* has a first end, and a second end opposite to the first end. The first end is connected to semiconductor elements in the package 4*a* of the second semiconductor device 4. The secondary DC wire 72*dc*, whose first end is connected to the semiconductor elements in the package 4*a*, is drawn out from the first side surface 4*c* of the package 4*a* and located to face the first side surface 4*c*. The second end of the secondary DC wire 72*dc* is connected to a first end of the coil body 5*a* of the choke coil 5 via the second side surface 5*d* of the package 5*b*.

The second semiconductor device 4 also has AC input/output terminals, and each of the AC input/output terminals is connected to a corresponding one of the second end of each of the secondary AC wires 72*ac*.

Specifically, each of the secondary AC wires 72*ac*, which is drawn out from the side surface 2*d* of the package 2*c*, is disposed to face a second side surface 4*d*, which is opposite to the first side surface 4*c*, of the package 4*a*. The second end of each of the secondary AC wires 72*ac* is connected to a corresponding one of the AC input/output terminals of he second semiconductor device 4 via the second side surface 4*d* of the package 4*a*.

Specifically, the secondary DC wire 72*dc* connects the second semiconductor device 4 and the choke coil 5, which constitute the second stack assembly 12, and the primary and secondary AC wires 71*ac* and 72*ac* are located to face the respective first and second side surfaces 4*c* and 4*d*. The first and second side surfaces 4*c* and 4*d* are outer surfaces which are different from each other and face different directions.

For example, the secondary DC wire 72*dc* is located across the second stack assembly 12 from the primary and secondary AC wires 71*ac* and 72*ac*.

Referring to FIGS. 1 and 2, a first end of an output DC wire 73*dc* is connected to the first end and a second end, which is opposite to the first end, of the coil body 5*a* of the choke coil 5. The output DC wire 73*dc* is drawn out from the first side surface 5*c* of the package 5*b*, and is connected to an output terminal of the power supply apparatus 1; the first side surface 5*c* is closely juxtaposed to the first side surface 4*c* of the package 4.

As described above, the power supply apparatus 1 according to the first embodiment has the following structural features.

Specifically, the primary DC wires 71*dc*, the pair of primary AC wires 71*ac* and secondary AC wires 72*ac*, and the pair of secondary DC wire 72*dc* and output DC wire 73*dc* are located in respective regions in a space. The space lies above the first major surface 6*a* of the base plate 6 and is located at the lateral sides of the first stack assembly 11 and/or the second stack assembly 12. The regions in the space are separated from each other via a part of the first stack assembly 11 and/or the second stack assembly 12.

Specifically, the first stack assembly 11 intervenes between the primary DC wires 71*dc* and the pair of primary AC wires 71*ac* and secondary AC wires 72*ac*. The second stack assembly 12 intervenes between the pair of primary AC wires 71*ac* and secondary AC wires 72*ac* and the pair of secondary DC wire 72*dc* and output DC wire 73*dc*. Additionally, the pair of primary AC wires 71*ac* and secondary AC wires 72*ac* intervenes is arranged between the first and second stack assemblies 11 and 12. This arrangement enables the first stack assembly 11 or the second stack assembly 12 to spatially separate the set of DC wires 71*dc*, 72*dc*, and 73*dc* and the set of AC wires 71*ac* and 72*ac*.

The primary DC wires 71*dc* are located to face the first side surface 3*c* of the first stack assembly 11, and the primary AC wires 71*ac* are located to face the second side surface 3*d* and the side surface 2*d* of the first stack assembly 11. The secondary AC wires 72*ac* are located to face the side surface 2*d* of the first stack assembly 11 and the second side surface 4*d* of the second stack assembly 12. The output DC wire 73*dc* is located to face the first side surface 5*c* of the second stack assembly 12.

The primary AC wires 71*ac* and the secondary Ac wires 72*ac* are drawn out from the same side surface 2*d* of the package 2*c* of the transformer 2 in the same direction that extends towards the choke coil 5 along the first major surface 6*a*.

Note that the base plate 6 is made of metal.

The power supply apparatus 1 according to the first embodiment is configured as a DC-DC converter, and is installed in a vehicle, such as an electric vehicle or a hybrid vehicle. Specifically, the power supply apparatus 1 aims to convert a high DC voltage output from the power source 131 into a low DC voltage, and supply the low DC voltage to a load 132, such as a battery for auxiliary devices. Referring to FIG. 3, the power supply apparatus 1 is connected between the DC power source 131 and the load 132, such as the battery for the auxiliary devices. To the DC power source 131, the primary circuit comprised of the first semiconductor device 3 is connected. To the load 132, the secondary circuit comprised of the second semiconductor device 4 is connected via the choke coil 5 and a capacitor 133 (see FIG. 3).

The primary circuit is configured as a switching circuit. The first semiconductor device 3 is configured as a semiconductor module incorporating a plurality of switching elements, such as switching elements SW1 to SW4; the switching elements constitute the switching circuit. The semiconductor module, which is the first semiconductor device 3, is connected to the DC power source 131 via a capacitor C and the primary DC wires 71*dc*. Insulated-gate bipolar transistors (IGBTs) or metal oxide semiconductor field-effect transistors (MOSFETs) can be used as the switching elements SW1 to SW4. Note that the first semiconductor device 3 need not be a semiconductor module, and can be configured as discrete semiconductor devices.

The secondary circuit is configured as a rectifier circuit. The second semiconductor device 4 is configured as a diode module incorporating a plurality of diodes, such as diodes D1 and D2; the diodes constitute the rectifier circuit. The second semiconductor device 4 can be configured as a semiconductor module incorporating a plurality of MOSFETs. The second semiconductor device 4 can be configured as discrete semiconductor devices.

As described above, the choke coil 5 and the capacitor 133 constitute a smoothing circuit.

DC power, which is output from the DC power source 131 and input to the power supply apparatus 1 according to the first embodiment, is converted into AC power by the primary circuit including the first semiconductor device 3, i.e. the switching circuit. The converted AC power is input to the primary coil 2*a* of the transformer 2. The input AC power is stepped down based on, for example, the turn ratio between the primary and secondary coils 2*a* and 2*b*. The stepped-down AC power is rectified by the secondary circuit including the second semiconductor device 4, i.e. the rectifier circuit, so that DC power is obtained. The obtained DC power, that is, DC power whose voltage is reduced as compared to the voltage of the DC power input to the power supply apparatus 1, is smoothed by the smoothing circuit, and thereafter, is output from the power supply circuit 1 to the load 132.

The following describes operations and advantageous effects provided by the power supply apparatus 1 according to the first embodiment.

The first semiconductor device 3 and the transformer 2 of the power supply apparatus 1 constitute the first stack assembly 11. This configuration enables the two-dimensional mounting space of the first semiconductor device 3 and the transformer 2 on the first major surface 6*a* of the base plate 6 to be downsized. This results in two-dimensional downsizing of the base plate 6 of the power supply apparatus 1.

The primary DC wires 71*dc* and the primary AC wires 71*ac* are drawn out from respective first and second predetermined portions of the first stack assembly 11. Specifically, the first and second side surfaces 3*c* and 3*d*, which are different outer surfaces facing different directions, of the first stack assembly 11 correspond to the respective first and second predetermined portions. The first and second side surfaces 3*c* and 3*d* are arranged to be opposite to each other. This arrangement enables the primary DC wires 71*dc* and the primary AC wires 71*ac* to be separated from each other via the first stack assembly 11. This results in reduction of the risk of noise being induced in the primary DC wires 71*dc* due to an alternating current flowing through the primary AC wires 71*ac*.

The primary DC wires 71*dc* and the secondary AC wires 72*ac* are also drawn out from the respective first side surface 3*c* and the side surface 2*d*, which are different outer surfaces facing different directions, of the first stack assembly 11. This arrangement enables the primary DC wires 71*dc* and the secondary AC wires 72*ac* to be separated from each other via the first stack assembly 11. This results in reduction of the risk of noise being induced in the primary DC wires 71*dc* due to an alternating current flowing through the secondary AC wires 72*ac*.

Specifically, the primary DC wires 71*dc* are located on the opposite side of the first stack assembly 11 from the primary AC wires 71*ac*. This arrangement results in efficient reduction of the risk of noise being induced in the primary DC wires 71*dc* due to an alternating current flowing through the primary AC wires 71*ac*.

Additionally, the primary DC wires 71*dc* are located on the opposite side of the first stack assembly 11 from the secondary AC wires 72*ac*. This arrangement results in further efficient reduction of the risk of noise being induced in the primary DC wires 71*dc* due to an alternating current flowing through the secondary AC wires 72*ac*.

The stacking direction of the first stack assembly 11 and the stacking direction of the second stack assembly 12 each match with the direction of the normal to the first major surface 6*a* of the base plate 6. This configuration results in two-dimensional downsizing of the base plate 6 of the power supply apparatus 1.

As described above, the first embodiment of the present disclosure provides the power supply apparatus 1 with smaller size and lower noise.

[Second Embodiment]

Figure 4:
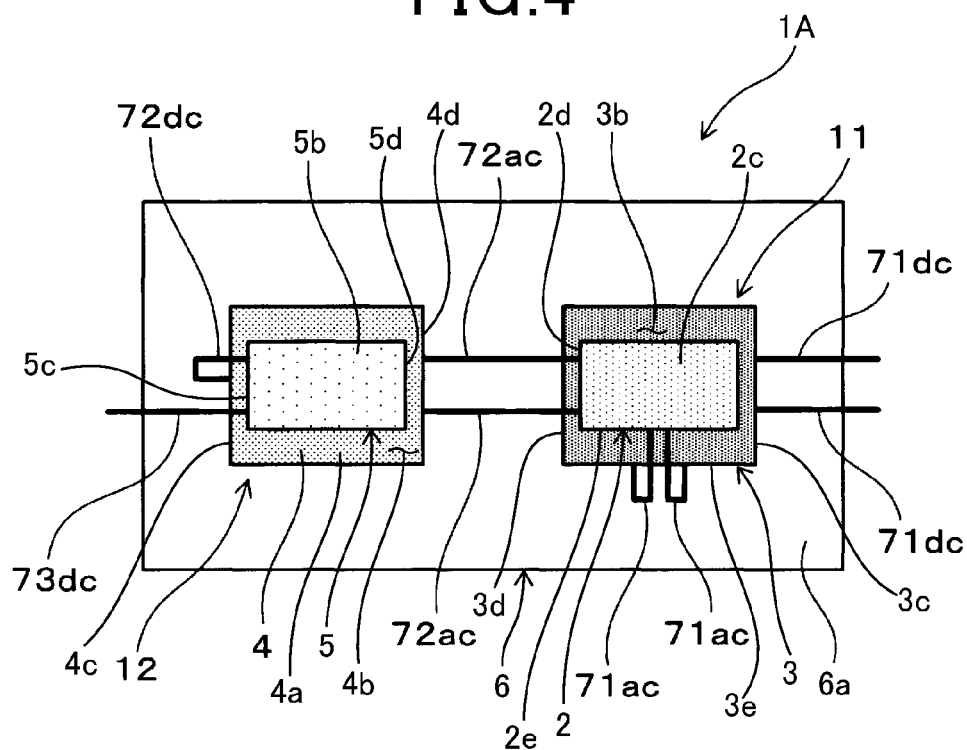
FIG. 4 is a plan view illustrating the schematic structure of a power supply apparatus according to the second embodiment of the present disclosure when the apparatus is viewed from its upper side perpendicular to a major surface of the base plate.

The following describes a power supply apparatus 1A according to the second embodiment of the present disclosure with reference to FIG. 4.

The structure and/or functions of the power supply apparatus 1A of the second embodiment are identical to the structure and/or functions of the power supply apparatus 1 except for the following points. The following therefore describes the different points mainly, and omits or simplifies the descriptions of like components, to which like reference numerals are assigned, between the first and second embodiments.

The primary DC wires 71*dc* of the power supply apparatus 1 according to the first embodiment are located to the first side surface 3*c* of the package 3*a* to face the first side surface 3*c*. The primary AC wires 71*ac* of the power supply apparatus 1 are located to the second side surface 3*d* of the package 3*a* to face the second side surface 3*d*. The first side surface 3*c* and the second side surface 3*d* are opposite to each other. Specifically, the primary DC wires 71*dc* are located on the opposite side of the first stack assembly 11 from the primary AC wires 71*ac*.

In contrast, referring to FIG. 4, the primary DC wires 71*dc* of the power supply apparatus 1A according to the second embodiment are located to the first side surface 3*c* of the package 3*a* to face the first side surface 3*c*. The primary AC wires 71*ac* of the power supply apparatus 1A are located to a third side surface 3*e* of the package 3*a* to face the third side surface 3*e*; the third side surface 3*e* is perpendicular to the first side surface 3*c*.

Specifically, the primary AC wires 71*ac* are located to the third side surface 3*e* of the first stack assembly 11 to face the third side surface 3*e*; the third side surface 3*e* is different from the second side surface 3*d* that is opposite to the first side surface 3*c* facing the primary DC wires 71*dc*.

As described above, the package 2*c* of the transformer 2 is mounted on the package 3*a* such that each side surface of the package 2*c* faces the same direction as the corresponding side surface of the package 3*a* and is substantially parallel to the corresponding side surface of the package 3*a*, thus constituting the first stack assembly 11.

Specifically, each side surface of the first stack assembly 11 is defined to be comprised of the corresponding one of the side surfaces of the package 2*c*, and the corresponding one of the side surfaces of the package 3*a*.

The primary DC wires 71*dc* and the primary AC wires 71*ac* are located to the respective different side surfaces of the package 3*a*, i.e. to the respective first and third side surfaces 3*c* and 3*e* perpendicular to each other, to face the respective first and third side surfaces 3*c* and 3*d*.

Like the first embodiment, the secondary AC wires 72*ac* of the second embodiment are located to face the second side surface 3*d*; the second side surface 3*d* is opposite to the first side surface 3*c* facing the primary DC wires 71*dc*. Specifically, the secondary AC wires 72*ac* and the primary AC wires 71*ac* are respectively drawn out from the side surface 2*d* and a side surface 2*e* of the package 2*c*; the side surfaces 2*d* and 2*e* are different from and perpendicular to each other. Note that the side surface 2*e* of the package 2*c* of the transformer 2 is closely juxtaposed to the third side surface 3*e* of the package 3*a*. The drawing-out direction of the primary AC wires 71*ac* and the secondary AC wires 72*ac* from the transformer 2 is parallel to the direction along the first major surface 6*a* of the base plate 6.

The other structures of the power supply apparatus 1A are substantially identical to the corresponding structures of the power supply apparatus 1 according to the first embodiment.

The power supply apparatus 1A according to the second embodiment is configured such that the set of DC wires including the primary DC wires 71*dc*, the secondary DC wire 72*dc*, and the output DC wire 73*dc* is located to be separated from the set of AC wires including the primary AC wires 71*ac* and the secondary AC wires 72*ac* via at least part of the first and second stack assemblies 11 and 12. This results in reduction of the risk of noise being induced in the set of DC wires due to an alternating current flowing through the set of AC wires. In other words, the power supply apparatus 1A according to the second embodiment achieves the operations and advantageous effects that are the same as the operations and advantageous effects of the power supply apparatus 1 according to the first embodiment.

[Third Embodiment]

Figure 5:
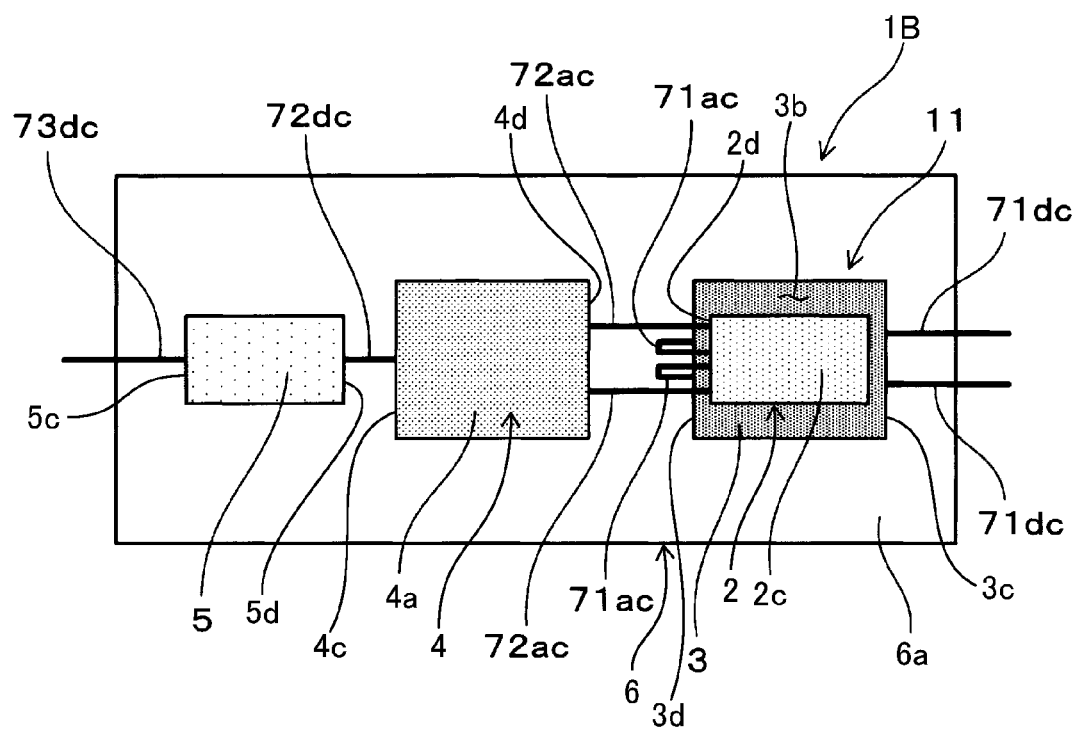
FIG. 5 is a plan view illustrating the schematic structure of a power supply apparatus according to the third embodiment of the present disclosure when the apparatus is viewed from its upper side perpendicular to a major surface of the base plate.

The following describes a power supply apparatus 1B according to the third embodiment of the present disclosure with reference to FIG. 5.

The structure and/or functions of the power supply apparatus 1B of the third embodiment are identical to the structure and/or functions of the power supply apparatus 1 except for the following points. The following therefore describes the different points mainly, and omits or simplifies the descriptions of like components, to which like reference numerals are assigned, between the first and third embodiments.

Referring to FIG. 5, the choke coil 5 of the power supply apparatus 1B according to the third embodiment is mounted on the first major surface 6*a* of the base plate 6 without being stacked on the second semiconductor device 4.

In particular, the first stack assembly 11, the second semiconductor device 4, and the choke coil 5 of the power supply apparatus 1B are aligned in a straight line on the first major surface 6*a* of the base plate 3.

The secondary DC wire 72*dc*, whose first end is connected to the semiconductor elements in the package 4*a*, is drawn out from the first side surface 4*c* of the package 4*a* and located to face the first side surface 4*c*. The second end of the secondary DC wire 72*dc* is connected to the first end of the coil body 5*a* of the choke coil 5 via the second side surface 5*d* of the package 5*b*.

Specifically, the second DC wire 72*dc* is located to face the first side surface 4*c* of the package 4*a*; the first side surface 4*c* is opposite to the second side surface 4*d* that faces the primary AC wires 71*ac* and the secondary AC wires 72*ac*. The output DC wire 73*dc* is located to face the first side surface 5*c* of the package 5*b*; the first side surface 5*c* is opposite to the second side surface 5*d* that faces the secondary DC wire 72*dc*.

The other structures of the power supply apparatus 1B are substantially identical to the corresponding structures of the power supply apparatus 1 according to the first embodiment.

The power supply apparatus 1B according to the third embodiment is configured such that the set of DC wires including the primary DC wires 71*dc*, the secondary DC wire 72*dc*, and the output DC wire 73*dc* is located to be separated from the set of AC wires including the primary AC wires 71*ac* and the secondary AC wires 72*ac* via at least part of the first stack assembly 11. This results in reduction of the risk of noise being induced in the set of DC wires due to an alternating current flowing through the set of AC wires. In other words, the power supply apparatus 1B according to the third embodiment achieves the operations and advantageous effects that are the same as the operations and advantageous effects of the power supply apparatus 1 according to the first embodiment.

[Fourth Embodiment]

Figure 6:
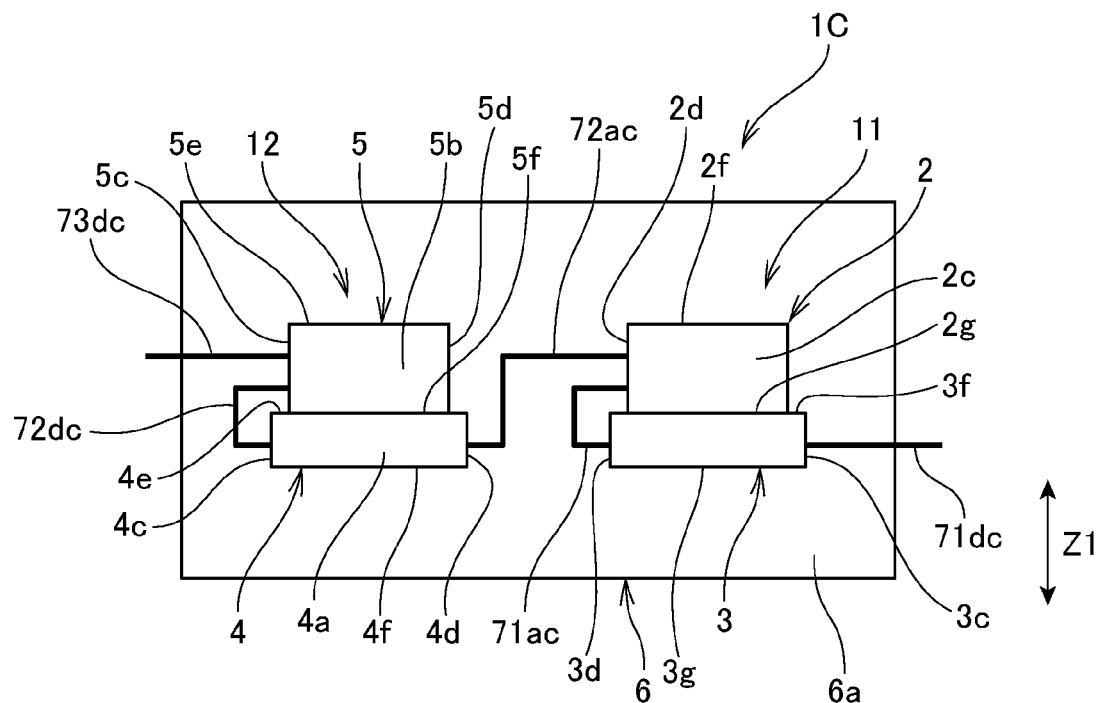
FIG. 6 is a plan view illustrating the schematic structure of a power supply apparatus according to the fourth embodiment of the present disclosure when the apparatus is viewed from its upper side perpendicular to a major surface of the base plate.
Figure 7:
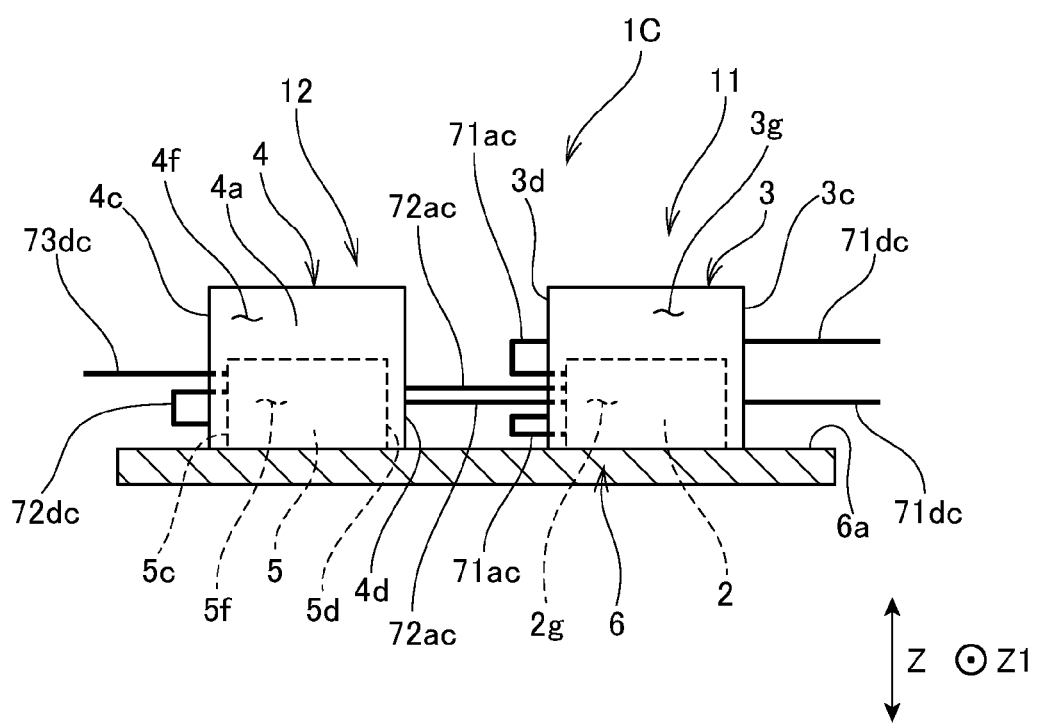
FIG. 7 is a side view illustrating the schematic structure of the power supply apparatus according to the fourth embodiment when the apparatus is viewed from one side direction parallel to the major surface of the base plate.

The following describes a power supply apparatus 1C according to the fourth embodiment of the present disclosure with reference to FIGS. 6 and 7.

The structure and/or functions of the power supply apparatus 1C of the fourth embodiment are identical to the structure and/or functions of the power supply apparatus 1 except for the following points. The following therefore describes the different points mainly, and omits or simplifies the descriptions of like components, to which like reference numerals are assigned, between the first and fourth embodiments.

Referring to FIGS. 6 and 7, the transformer 2 of the power supply apparatus 1C is mounted on the first major surface 6a of the base plate 6 while the bottom surface of the package 2c abuts on the first major surface 6a. The package 2c of the transformer 2 has opposing side surfaces 2f and 2g that are perpendicular to the side surface 2d.

The first semiconductor device 3 is mounted on the first major surface 6a of the base plate 6 while the bottom surface of the package 3a abuts on the first major surface 6a. The package 3a of the first semiconductor device 3 has opposing side surfaces 3f and 3g, each of which is perpendicular to the side surfaces 3c and 3d.

The package 2c of the transformer 2 is mounted on the first major surface 6a such that the side surface 2g abuts on the side 3f of the package 3a of the first semiconductor device 3. The above-arranged transformer 2 and the first semiconductor device 3 provide the first stack assembly 11 configured such that the transformer 2 and the first semiconductor device 3 are stacked to each other along the direction that is parallel to the two-dimensional direction, i.e. the extending direction, of the first major surface 6a of the base plate 6. The direction that is parallel to the two-dimensional direction, i.e. the extending direction, is illustrated by Z1 in FIGS. 6 and 7.

In addition, referring to FIGS. 6 and 7, the choke coil 5 of the power supply apparatus 1C is mounted on the first major surface 6a while the bottom surface of the package 5b abuts on the first major surface 6a. The package 5b of the choke coil 5 has opposing third and fourth side surfaces 5e and 5f, each of which is perpendicular to the first and second side surfaces 5c and 5d.

The second semiconductor device 4 is mounted on the first major surface 6a of the base plate 6 while the bottom surface of the package 4a abuts on the first major surface 6a. The package 4a of the second semiconductor device 4 has opposing third and fourth side surfaces 4e and 4f, each of which is perpendicular to the first and second side surfaces 4c and 4d.

The package 5b of the choke coil 5 is mounted on the first major surface 6a such that the fourth side surface 5f abuts on the third side surface 4e of the package 4a of the second semiconductor device 4. The above-arranged choke coil 5 and the second semiconductor device 4 provide the second stack assembly 12 configured such that the choke coil 5 and the second semiconductor device 4 are stacked to each other along the direction Z1 that is parallel to the two-dimensional direction, i.e. the extending direction, of the first major surface 6a of the base plate 6.

Note that the positional relationships between the first and second stack assemblies 11 and 12 and the group of primary DC wires 71dc, primary AC wires 71ac, secondary AC wires 72ac, secondary DC wire 72dc, and output DC wire 73dc are identical to those according to the first embodiment.

The other structures of the power supply apparatus 1C are substantially identical to the corresponding structures of the power supply apparatus 1 according to the first embodiment.

The power supply apparatus 1C according to the fourth embodiment is configured such that the set of DC wires including the primary DC wires 71dc, the secondary DC wire 72dc, and the output DC wire 73dc is located to be separated from the set of AC wires including the primary AC wires 71ac and the secondary AC wires 72ac via at least part of the first stack assembly 11. This results in reduction of the risk of noise being induced in the set of DC wires due to an alternating current flowing through the set of AC wires. In other words, the power supply apparatus 1C according to the fourth embodiment achieves the operations and advantageous effects that are the same as the operations and advantageous effects of the power supply apparatus 1 according to the first embodiment.

The power supply apparatuses according to the present disclosure are not limited to the power supply apparatuses 1 to 1C according to the respective first to fourth embodiments. For example, the positional relationship between each of the wires including the primary DC wires 71dc, the primary AC wires 71ac, the secondary AC wires 72ac, the secondary DC wire 72dc, and the output DC wire 73dc and each of the components including the transformer 2, the first semiconductor device 3, the second semiconductor device 4, and the choke coil 5 can be modified. Each of the modifications needs to configure that at least the primary DC wires 71dc are arranged to be separated from the primary AC wires 71ac via at least part of the first stack assembly 11.

Each of the first to fourth embodiments is configured such that the primary DC wires 71dc are located to the first side surface 3c to face the first side surface 3c, and the primary AC wires 71ac are located to the second side surface 3d to face the second side surface 3d; the first and second side surfaces are opposite to each other. The present disclosure is however not limited to the configuration. For example, the primary DC wires 71dc or the primary AC wires 71ac can be located to face a surface of the first stack assembly 11; the surface is opposite to the base plate 6, such as the top surface of the package 2c or the top surface of the package 3a.

Each of the first to fourth embodiments is configured such that the package 2c of the transformer 2 and the package 3a of the first semiconductor device 3 are configured as discrete packages. The present disclosure is however not limited to the configuration. Specifically, the package 2c of the transformer 2 and the package 3a of the first semiconductor device 3 can be configured as a common package.

In this modification, for example, the side surfaces 2d and 3d, which face the same direction, of the first stack assembly 11 illustrated in FIG. 2 constitute a common outer surface of the common package.

Similarly, each of the first to fourth embodiments is configured such that the package 4a of the second semiconductor device 4 and the package 5b of the choke coil 5 are configured as discrete packages. The present disclosure is however not limited to the configuration. Specifically, the package 4a of the second semiconductor device 4 and the package 5b of the choke coil 5 can be configured as a common package.

In this modification, for example, the side surfaces 4c and 5c, which face the same direction, of the second stack assembly 12 illustrated in FIG. 3 constitute a common outer surface of the common package.

The above first embodiment is configured such that (1) The transformer 2 is mounted on the first semiconductor device 3 mounted on the major surface 6a of the base plate 6 to constitute the first stack assembly 11

(2) The choke coil 5 is mounted on the second semiconductor device 4 mounted on the major surface 6a of the base plate 6 to constitute the second stack assembly 12.

The present disclosure is however not limited to the configuration.

Specifically, the first semiconductor device 3 can be mounted on the transformer 2 mounted on the major surface 6a of the base plate 6 to constitute the first stack assembly 11, and the second semiconductor device 4 can be mounted on the choke coil 5 mounted on the major surface 6a of the base plate 6 to constitute the second stack assembly 12.

In each of the first and second stack assemblies 11 and 12, a component, referred to as a lower-side component, mounted on the major surface 6a of the base plate 6 preferably matches in size with a component, referred to as an upper-side component, mounted on the lower-side component. Alternatively, in each of the first and second stack assemblies 11 and 12, the lower-side component mounted on the major surface 6a of the base plate 6 is preferably larger in size than the upper-side component mounted on the lower-side component.

[Reference Signs List]
 1 Power supply apparatus
 11 First stack assembly (Stack assembly)
 2 Transformer
 3 First semiconductor device
 4 Second semiconductor device
 5 Choke coil
 6 Base plate
 71dc Primary DC wire
 71ac Primary AC wire

The invention claimed is:

1. A power supply apparatus comprising:
 a stack assembly comprising:
  a transformer including a primary coil and a secondary coil; and
  a first semiconductor device constituting a primary circuit connected to the primary coil of the transformer,
 one of the transformer and the first semiconductor device being stacked on the other thereof to constitute the stack assembly;
 a second semiconductor device constituting a secondary circuit connected to the secondary coil of the transformer;
 a choke coil connected to the second semiconductor device;
 a base plate having a major surface, the stack assembly, the second semiconductor device, and the choke coil being located on the major surface;
 a primary direct-current wire connecting the first semiconductor device to a direct-current power source and drawn out from a first predetermined portion of the stack assembly; and
 a primary alternating-current wire connecting the first semiconductor device and the transformer and drawn out from a second predetermined portion of the stack assembly,
 the primary direct-current wire and the primary alternating-current wire being located to be separated from each other via at least a part of the stack assembly.

2. The power supply apparatus according to claim 1, wherein:
 the stack assembly has a plurality of outer surfaces including a first outer surface and a second outer surface different from each other, the first and second outer surfaces respectively facing different directions;
 the primary direct-current wire is drawn out from the first outer surface that is the first predetermined portion of the stack assembly; and
 the primary alternating-current wire is drawn out from the second outer surface that is the second predetermined portion of the stack assembly.

3. The power supply apparatus according to claim 2, further comprising:

a secondary alternating-current wire connecting the transformer and the second semiconductor device and drawn out from one outer surface of the stack assembly, the one outer surface being different from the first outer surface of the stack assembly.

4. The power supply apparatus according to claim 2, wherein:
 the first outer surface and the second outer surface of the stack assembly are located to be opposite to each other; and
 the primary direct-current wire and the primary alternating-current wire are located across the stack assembly from each other.

5. The power supply apparatus according to claim 2, wherein the primary direct-current wire and the secondary alternating-current wire are located across the stack assembly from each other.

6. The power supply apparatus according to of claim 2, wherein:
 the stack assembly constructed such that one of the transformer and the first semiconductor device is mounted on the other thereof is a first stack assembly;
 one of the second semiconductor device and the choke coil is stacked on the other of the second semiconductor device and the choke coil to constitute a second stack assembly;
 the second stack assembly has a plurality of outer surfaces including a first outer surface and a second outer surface different from each other, the first and second outer surfaces respectively facing different directions; and
 the secondary alternating-current wire is configured to be connected to the second semiconductor device via the first outer surface of the second stack assembly,
 the power supply apparatus further comprising:
 a secondary direct-current wire connecting the second semiconductor device and the choke coil and drawn out from the second outer surface of the second stack assembly.

7. The power supply apparatus according to claim 6, wherein:
 the first outer surface and the second outer surface of the second stack assembly are located to be opposite to each other; and
 the secondary alternating-current wire and the secondary direct-current wire are located across the second stack assembly from each other.

8. The power supply apparatus according to claim 6, further comprising:
 an output direct-current wire for direct-current output of the power supply apparatus,
 the output direct-current wire being connected to the choke coil and drawn out from one outer surface of the plurality of outer surfaces of the second stack assembly, the one outer surface being different from the first outer surface of the second stack assembly.

9. The power supply apparatus according to claim 1, wherein:
 one of the transformer and the first semiconductor device is mounted on the major surface of the base plate; and
 the other of the transformer and the first semiconductor device is mounted on one of the transformer and the first semiconductor device, thus constituting the stack assembly.

10. The power supply apparatus according to claim 1, wherein:

one of the transformer and the first semiconductor device is mounted on the major surface of the base plate; and the other of the transformer and the first semiconductor device is mounted on the major surface while being adjacent to one of the transformer and the first semiconductor device, thus constituting the stack assembly.

\* \* \* \* \*